(12) United States Patent
Hart et al.

(10) Patent No.: US 11,276,622 B2
(45) Date of Patent: Mar. 15, 2022

(54) INVERTER ARRANGEMENT

(71) Applicant: YASA LIMITED, Kidlington (GB)

(72) Inventors: Simon David Hart, Powys (GB); Tim Woolmer, Waterperry (GB); Christopher Stuart Malam, Powys (GB); Tom Hillman, Oxford (GB); Richard Phillips, Banbury (GB)

(73) Assignee: YASA LIMITED, Kidlington (GB)

( * ) Notice: Subject to any disclaimer, the term of this patent is extended or adjusted under 35 U.S.C. 154(b) by 176 days.

(21) Appl. No.: 16/482,140

(22) PCT Filed: Jan. 30, 2018

(86) PCT No.: PCT/GB2018/050258
§ 371 (c)(1),
(2) Date: Jul. 30, 2019

(87) PCT Pub. No.: WO2018/138530
PCT Pub. Date: Aug. 2, 2018

(65) Prior Publication Data
US 2020/0227334 A1    Jul. 16, 2020

(30) Foreign Application Priority Data
Jan. 30, 2017    (GB) ...................... 1701487

(51) Int. Cl.
*H01L 23/367*    (2006.01)
*H01L 23/40*    (2006.01)
(Continued)

(52) U.S. Cl.
CPC ............ *H01L 23/367* (2013.01); *H01L 23/40* (2013.01); *H01L 23/44* (2013.01); *H01L 25/04* (2013.01);
(Continued)

(58) Field of Classification Search
CPC ... H01L 23/367; H01L 23/3672; H01L 23/40; H01L 23/44; H01L 23/473; H01L 25/04;
(Continued)

(56) References Cited

U.S. PATENT DOCUMENTS 4,010,489 A    3/1977 Bourbeau et al.
4,399,484 A    8/1983 Mayer
(Continued)

FOREIGN PATENT DOCUMENTS

EP    2043412 A1    4/2009
GB    2403354 A    12/2004
(Continued)

OTHER PUBLICATIONS

Final Office Action, relating to U.S. Appl. No. 16/482,147, dated Oct. 5, 2020.
(Continued)

*Primary Examiner* — Sonya McCall-Shepard
(74) *Attorney, Agent, or Firm* — Meunier Carlin & Curfman LLC

(57) ABSTRACT

A semiconductor arrangement and an inverter incorporating the semiconductor arrangement, in particular to an inverter for use with traction power units e.g. for on and off road vehicles and stationary power inversion, are described. In the arrangement, semiconductor devices are thermally and electrically coupled to a heatsink as a module. The heatsink is configured as a bus bar to electrically connect the one or more semiconductor devices together to transmit power between the one or more semiconductor devices. The semiconductor devices may be cooled using the structure to which they are attached, and also immersed in a cooling medium to further increase the cooling of the device.

21 Claims, 11 Drawing Sheets

(51) Int. Cl.
  *H01L 23/44*    (2006.01)
  *H01L 25/04*    (2014.01)
  *H01L 25/11*    (2006.01)
  *H01L 23/473*   (2006.01)
  *H02M 7/00*    (2006.01)
  *H02M 7/44*    (2006.01)
  *H05K 7/20*    (2006.01)

(52) U.S. Cl.
  CPC ........... *H01L 25/115* (2013.01); *H02M 7/003* (2013.01); *H02M 7/44* (2013.01); *H05K 7/2089* (2013.01)

(58) Field of Classification Search
  CPC ....... H01L 25/115; H02M 7/003; H02M 7/44; H05K 7/2089
  See application file for complete search history.

(56) References Cited

U.S. PATENT DOCUMENTS

| | | | |
|---|---|---|---|
| 5,003,376 A * | 3/1991 | Iversen | H01L 23/473 165/80.3 |
| 5,099,884 A | 3/1992 | Monahan | |
| 5,380,956 A | 1/1995 | Loo et al. | |
| 5,841,634 A | 11/1998 | Visser | |
| 6,278,179 B1 | 8/2001 | Mermet-Guyennet | |
| 6,501,172 B1 | 12/2002 | Fukada et al. | |
| 7,812,443 B2 | 10/2010 | Tokuyama et al. | |
| 7,957,145 B2 | 6/2011 | Suzuki et al. | |
| 8,659,896 B2 | 2/2014 | Dede et al. | |
| 2006/0096299 A1 * | 5/2006 | Mamitsu | H05K 7/20927 62/3.2 |
| 2009/0154101 A1 | 6/2009 | Korich et al. | |
| 2009/0161301 A1 | 6/2009 | Woody et al. | |
| 2010/0038774 A1 | 2/2010 | Zhang et al. | |
| 2010/0302733 A1 * | 12/2010 | Woody | H01L 25/071 361/699 |
| 2011/0103019 A1 | 5/2011 | Campbell | |
| 2011/0141690 A1 | 6/2011 | Le et al. | |
| 2011/0242760 A1 | 10/2011 | Bott et al. | |
| 2014/0204532 A1 | 7/2014 | Mehring | |
| 2014/0355212 A1 | 12/2014 | Campbell et al. | |
| 2017/0012030 A1 * | 1/2017 | Wang | H01L 24/32 |
| 2017/0265328 A1 | 9/2017 | Sasaki et al. | |

FOREIGN PATENT DOCUMENTS

| | | | |
|---|---|---|---|
| JP | 2006310486 | * 11/2006 | ........... H01L 23/367 |
| JP | 2012016095 A | 1/2012 | |
| JP | 2016158358 A | 9/2016 | |
| WO | 2005048672 A1 | 5/2005 | |
| WO | 2010092400 A2 | 8/2010 | |
| WO | 2016008509 A1 | 1/2016 | |
| WO | 2018138532 A1 | 8/2018 | |

OTHER PUBLICATIONS

Non-Final Office Action relating to U.S. Appl. No. 16/482,147, dated Apr. 17, 2020.
Examination Report under Section 18(3) conducted in GB1701486.1, dated Jul. 18, 2019.
Examination Report under Section 18(3) in related application GB1701487.9, dated Aug. 2, 2019.
International Search Report and Written Opinion, issued by the International Searching Authority (EPO) in Application No. PCT/GB2018/050258 dated Apr. 16, 2018, 13 pages.
Combined Search and Examination Report issued by the Intellectual Property Office (GB) in Application No. GB 1701487.9 dated Jun. 30, 2017, 7 pages.
International Search Report and Written Opinion, issued by the International Searching Authority (EPO) in Application No. PCT/GB2018/050260 dated Apr. 16, 2018, 12 pages.
Combined Search and Examination Report issued by the Intellectual Property Office (GB) in Application No. GB1701486.1 dated Jun. 13, 2017, 6 pages.
Communication pursuant to Article 94(3) EPC relating to European Application No. 18 702 555.6, dated Sep. 4, 2020. 6 pages.

\* cited by examiner

INVERTER ARRANGEMENT

TECHNICAL FIELD

The present invention relates to a semiconductor arrangement and an inverter incorporating the semiconductor arrangement, in particular to an inverter for use with traction power units e.g. for on and off road vehicles and stationary power inversion.

BACKGROUND TO THE INVENTION

Electric machines have developed significantly over the past two decades driven by a worldwide trend towards "more electric" with improvements being shown in power and torque density and also maximum and continuous power outputs i.e. electric machines have gotten smaller and/or their power outputs have increased.

Instances of electric machines are found in e.g.: hybrid vehicles of various types, full electric vehicles, propeller drives found in amphibious and air craft and mobile and stationary generators, in land, sea and air applications. There are many other instances where electric machines are already in use or are finding new applications.

There is particular advantage of high power density and small package size inverters in some applications where present day internal combustion engine (ICE) technology is being hybridised and space is limited. Increasing space to accommodate electric technology alongside ICE's where engine components are already tightly packed may impact panels and component parts and to modify the space available frequently requires new tooling with concomitant often prohibitive costs.

In many instances power inverter technologies are lagging behind electric machine advances and this has led to situations where appropriately sized power inverters are not available for best in class electric machines, i.e. power supply inverters are disproportionally large in comparison to state-of-the-art electric machines.

Inverters in such instances convert direct current typically derived from batteries or other sources to alternating current often, but not always in 3-phase format to provide power to electric machines.

In addition to low power density, inverter overheating can occur when maximum or in some instances even continuous rated power is drawn by advanced electric machines.

As is well known electric machines produce joule heating ($I^2R$) losses through the passage of current in electrical wiring connections, operation of passive and active components and induction and it is efforts to minimise these losses that have increased power densities through inventions such as WO2010092400 where said joule heating losses are managed and removed from the machine, enabling them to be worked harder and so have dramatically improved power/torque densities.

Working electric machines harder requires power supply inverters to work similarly hard in supplying AC power frequently derived from a DC source. This so called "power inversion" is carried out by various electronic components arranged to handle; high voltage, fast switching and temporary power storage.

It is well known that electrical and electronic devices also generate joule heating commensurate with current passed and an increase in temperature of passive and active electronic devices can lead to reduced inverter efficiency and at worst premature failure of inverter components. Accordingly inverter heat dissipation mechanisms are required.

Several approaches have been made to tackle joule heating temperature rise in electric modules. WO2016008509 describes electronic components arranged to be in mechanical/thermal contact with a plurality of heat sinks with electronic components and heatsinks submerged in coolant medium in which the heat sinks themselves are arranged to guide the cooling medium in a zigzag-shaped flow of the cooling medium from one electronic component to another from the inlet of the enclosure to its outlet.

A drawback of this approach is that the electronic components are electrically isolated from the heat-sinks and increase in thermal resistance caused by insulation, reduces power dissipation in electronic components and packing density of components is not compact thereby increasing the size of the electronic module and effectively lowering its power density.

An alternative approach is offered by WO2005048672 which teaches a doubled walled electrical or electronic device in which heat generated by electrical and electronic components is dissipated by mounting said components on an inner wall of said double walled casing in which the inner wall provides a heat absorption surface and the outer wall provides an air ducting through which fan driven air transfers the heat from the inner casing to fan forced air which is ducted away.

A disadvantage of this approach is also thermal resistance between electrical and electronic components which are thermally but not electrically connected to the inner casing and so power dissipation in said components is less than could be achieved and electronic/electrical devices assembled using this double walled casing approach are thereby larger.

US2014355212 teaches a motor controller assembly submersed in a non-conductive fluorocarbon cooling liquid. Said motor controller including power board module and semiconductor switches of MOSFETS. Each switch having an individual clip-on heat-sink to increase the surface area available for cooling liquid.

Though US2014355212 markedly improves cooling by virtue of the cooling capacity of the fluorocarbon liquid coolant, the mounting of heatsinks on individual switch components decreases component packing density which directly impacts on the size of a motor controller.

It is generally desirable to improve thermal contact between heat generating electrical/electronic components and heat spreading/dissipating substrates and to take advantage of improved heat transfer and cooling to closely pack said components so as to miniaturise assemblies and place said components in electrically beneficial arrangements.

We have therefore appreciated the need for an improved semiconductor arrangement, and an inverter incorporating that semiconductor arrangement.

SUMMARY OF INVENTION

The present invention therefore provides a semiconductor arrangement, comprising: a module having one or more semiconductor devices thermally and electrically coupled to a heatsink, the heatsink being configured as a bus bar to electrically connect the one or more semiconductor devices together to transmit power between the one or more semiconductor devices and the heatsink comprising one or more heat exchanging elements to transfer the heat from the heatsink into the surrounding environment, wherein the semiconductor arrangement is immersed in a cooling medium for cooling the semiconductor arrangement.

The semiconductor arrangement may be made up of one or more semiconductor devices which are semiconductor power devices comprising; insulated gate bipolar transistors (IGBTs), Silicon carbide (SiC) semiconducting switch devices, metal oxide semiconducting field effect transistors (MOSFETs), power diodes and similar devices.

The semiconducting power devices may be mechanically attached or bonded to an electrically and thermally conducting heat sink. The heat exchanging elements may comprise: fins, pin-holes, holes or slots of regular or irregular profiles.

The present invention also provides an inverter for converting DC to AC, comprising: one or more inputs for receiving one or more DC voltages; one or more outputs for outputting one or more AC voltages; and a plurality of semiconductor arrangement modules as described above, the plurality of semiconductor arrangement modules being coupled to the one or more inputs and one or more outputs, the semiconductor arrangement modules being mounted to a Printed Circuit Board (PCB), the PCB providing electrical connections between the semiconductor devices, the one or more inputs and the one or more outputs, and a housing for housing the plurality of semiconductor arrangement modules in a chamber within the housing, the housing comprising inlet and outlet ports in fluid communication with the chamber respectively for receiving and outputting a cooling medium, wherein the chamber is flooded with a cooling medium to cool the inverter.

In this inverter, the input DC voltages may comprise a +DC input voltage and/or a −DC input voltage, and wherein the AC output may comprise an AC phase output voltage.

Each of the plurality of semiconductor arrangement modules has a longitudinal axis, and wherein each module may be mounted on the PCB such that the longitudinal axes of the modules are parallel to one another. The modules may be arranged on the PCB so as to be symmetrical in at least one axis.

The modules may be electrically arranged to provide a three level T-type topology or a two level topology.

When configured as a three level T-type topology, the inverter may comprises a second DC output at a DC/2 voltage.

The electrical arrangement between the modules may be configurable via one or more connector bars, each of the one or more connector bars connecting the heatsink bus bars of two modules together in order to provide the three level T-type topology or the two level topology.

The inverter may comprise four modules arranged in a three level T-type configuration, and wherein the heatsink bus bars of two of the four modules are electrically connected together using a connector bar. In this arrangement, the heatsink bus bars of the second and third of the modules, located on the PCB between the first and fourth modules, may be electrically connected together using the connector bar.

The inverter may comprise four modules arranged in a two level configuration, and wherein the heatsink bus bars of a first group of two modules are electrically connected together using a first connector bar, and wherein the heatsink bus bars of a second group of two modules are electrically connected together using a second connector bar. In this arrangement, the second and third of the modules may be located on the PCB between the first and fourth modules, and wherein the heatsink bus bars of the first and third modules are electrically connected together using the first connector bar, and wherein the heatsink bus bars of the second and fourth modules are electrically connected together using the second connector bar The inverter may comprise three modules arranged in a three level T-type configuration, where first and third of the modules being located on the PCB either side of the second module.

In any of the above, the inverter may comprise two or more pluralities of semiconductor arrangement modules, each of the two or more pluralities of semiconductor arrangement modules providing one phase of a multiphase output AC voltage.

The cooling medium may be a dielectric cooling medium, such as a dielectric fluid.

In the above inverter, the PCB and additional electrical and electronic components mounted on the PCB may be located within the chamber and immersed in the cooling medium.

The cooling fluid may be pumped so as to cause the medium to flow between the inlet port and the outlet port.

The inverter inlet port and outlet port may be coupled to a cooling circuit comprising a heat exchanger, the heat exchanger for removing heat from the cooling medium.

The output of the inverter may be configured to power an electric motor, and wherein the cooling circuit is in fluid communication with a cooling circuit of the electric motor.

The output of the inverter may be configured to power an electric motor.

DESCRIPTION OF DRAWINGS

The present invention will now be described, by way of example only, and with reference to the accompanying drawings, in which.

DETAILED DESCRIPTION OF PREFERRED EMBODIMENTS

In brief, the invention utilises an arrangement where semiconductor devices are thermally and electrically coupled to a heatsink as a module. The heatsink is configured as a bus bar to electrically connect the one or more semiconductor devices together to transmit power between the one or more semiconductor devices. Advantageously, this means that the semiconductor devices may be cooled using the structure to which they are electrically and thermally attached. Furthermore, the invention enables this modular structure to be used in larger devices, such as inverters, and also that these modules may be immersed in a cooling medium to further increase the cooling of the devices.

Figure 1:
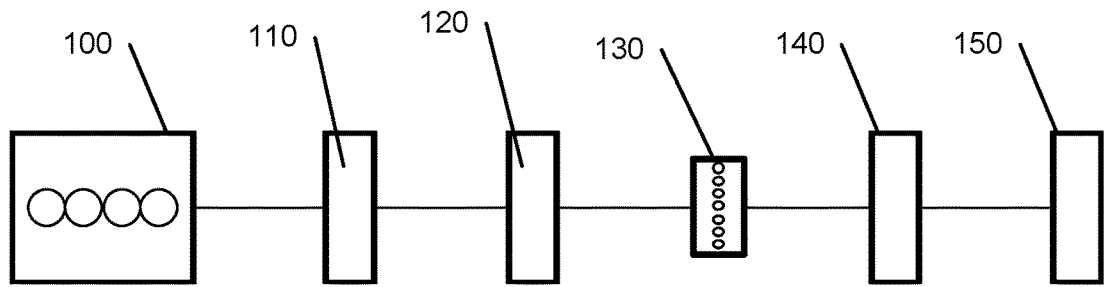
FIG. 1 shows a schematic of full hybrid range extender.

With reference to FIG. 1 there is shown an exemplar use of the present invention in a full hybrid range extender wherein an internal combustion engine 100 mechanically linked so as to drive an electric motor generator 110 is further connected to a controller/inverter assembly 120 (outputting a DC voltage), which in turn is connected to a battery 130, said battery being further connected to a second controller/inverter assembly 140 (outputting a 3-phase AC voltage) which provides power to a second electric motor/generator traction unit 150.

This is but one example of the applications of inverter technology and it will be understood there are many mobile applications for land, water and air where inverters find application and similarly for stationary machines.

Though examples of the present invention are made with reference to inversion of DC to AC power, those skilled in the art will see that inverters may be configured to be unidirectional i.e. invert DC to AC or AC to DC or inverters may be configured to be bidirectional i.e. DC to AC and AC to DC and the present invention is applicable to all such configurations of power inversion.

Figure 2A:
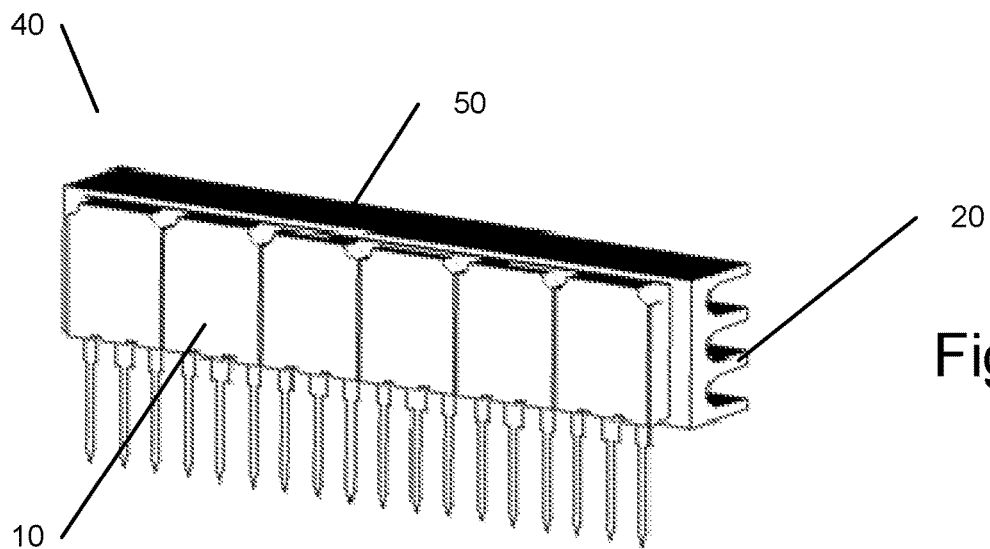
FIG. 2 shows power semiconductors bonded to heatsinks.

FIGS. 2a,b,c shows an example semiconductor arrangement. In this arrangement a group of power semiconductor switches 10 bonded directly, or attached to heatsinks 20 in groupings relevant to the end electrical module application. Bonding may for example be a high temperature soldering method (not described) carried out in a short time frame so as not to adversely affect the working of the semiconductor components 10. The use of direct bonding provides for a low electrical resistance electrical interface and a correspondingly low thermal resistance thermal interface.

FIGS. 2a,b,c shows three different configurations of busbar-heatsink 20. Usually it is the collector (as opposed to emitter or gate) which is electrically attached to the heatsink 20 and by paralleling up semiconductor switch devices 10 such as insulated-gate bipolar transistors (IGBTs) it is possible to correspondingly increase current outputs.

The power semiconductors 10 are directly soldered to an electrically and thermally conductive heatsink 20 to remove heat from the switch devices 10 which are arranged to provide one active arm of a phase inverter 40.

Heatsink-busbars are electrically conducting and have correspondingly high thermal conductivity and are typically made from high thermal and electrical conductivity materials e.g. aluminium or copper which may be alloyed with other elements to enhance processing/forming characteristics.

It may be seen in FIGS. 2a,b,c semiconductor switches 10 can be mounted in close proximity and in formats that are easily replicated to form modules 40 with great precision thereby optimising the potential for mechanical symmetry a strong contributor to desired electrical symmetry. Semiconductor and electrical component layout is designed to minimise inter-component inductance, which in part is achieved by close proximity of components, and also provides symmetrical paths for each phase and particularly semiconductor device switches 10 within each phase.

Figure 2B:
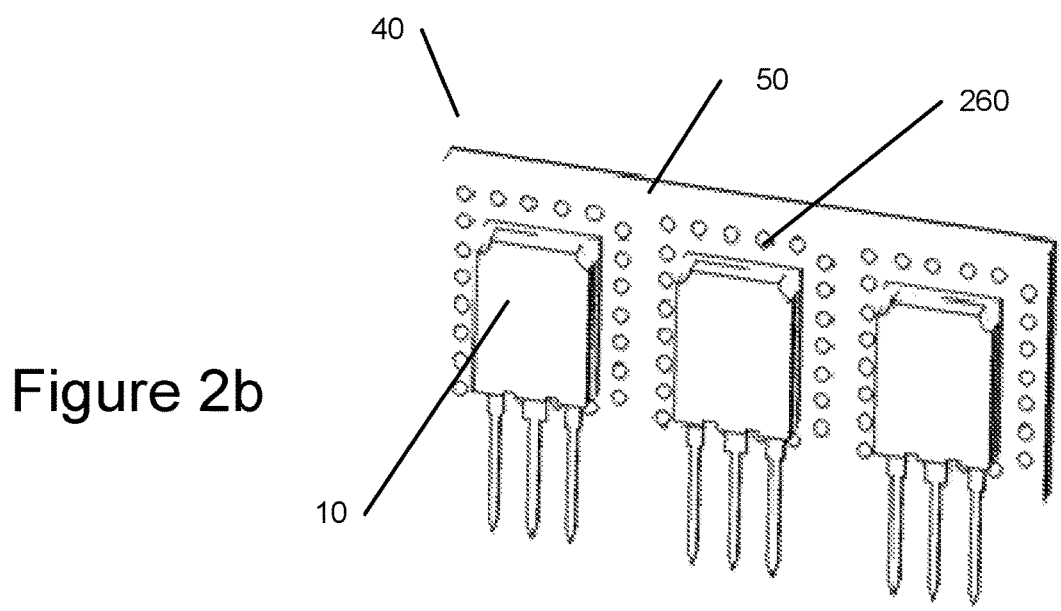

Different approaches to heat spreading from semiconductor devices and subsequent dissipation may be used in the present invention such as commonly used finned heat sinks, FIGS. 2a, c, a more elaborate pin grid heat sink (not shown) or a new surprisingly efficient holed heatsink FIG. 2b, where in each case heatsinks are also integral components of electrical circuitry, usually acting as high current busbars.

Minimising inductance within power component current paths is important for improving efficiency when switching high current. Minimising inductance may be achieved by using straight and not curved conductor paths and maintaining said conductor paths as short as possible.

Figure 3:
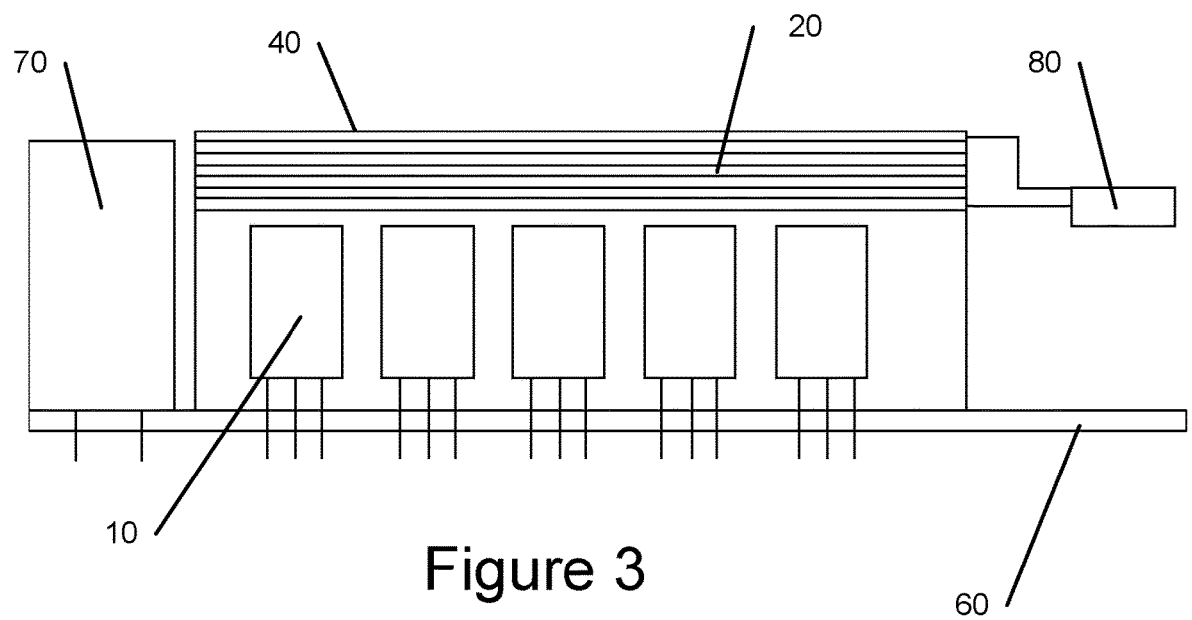
FIG. 3 shows a heatsink arrangement showing busbar function.

FIG. 3 shows a module 40 arrangement of semiconducting device switches 10 electrically bonded to a heatsink-busbar 20, and further electrically connected by printed circuit board 60 and to capacitor 70. Output is via connector 80

Stray inductance within current paths leads to damped oscillations, sometimes referred to as "ringing", which happen after every switching event. Such oscillations are superimposed above the supply voltage leading to semiconductor devices and capacitors experiencing voltages higher than the supply for short intervals. This affects the rating and lifetime of devices and increases emission of Electro-Magnetic Interference (EMI) produced by the product. Oscillation peaks can be reduced by increasing the time taken for the semiconductor devices to turn from the low impedance "on" state to the high impedance "off" state. Unfortunately, the change from the "on" to the "off" state involves semiconductor switch devices moving through a linear mode wherein the resistance gradually increases from very low "on" to very high "off". During this time the device dissipates energy and heats up. So devices require more cooling or the current rating of the inverter must be reduced. Therefore in general higher switching speeds are preferred, but this requires low stray inductance. In practice a compromise on switching speed and heat dissipation is reached.

Figure 2C:
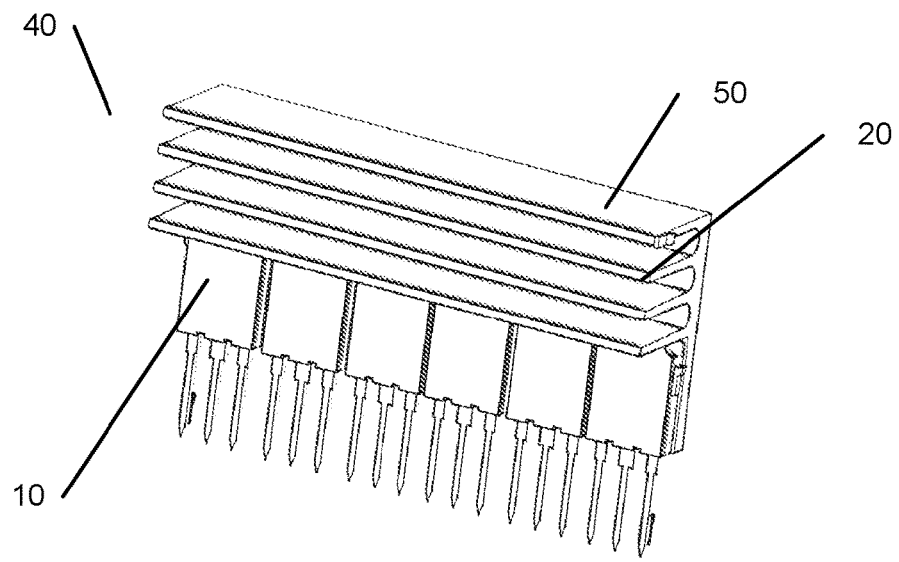

The present invention provides a valuable advantage in these respects enabling close proximity (short conduction paths) as shown in FIGS. 2 and 3 where closely spaced semiconductor components 10 solder connected (high thermal dissipation pathway) to each other by way of large low inductance busbar heatsinks 20. Paralleling semiconductor device switches 10 increases current capacity and series connection enables voltage sharing. Both approaches come with associated managing circuits clamping and snubber for equalising current and voltage respectively. A valuable advantage offered by the present invention is that with excellent physical symmetry the task of these equalising circuits is directed mainly towards intra-component variations.

Provision of phases within an inverter having matched impedances provides a symmetrical design meaning each phase behaves in a similar fashion. Symmetrical phases greatly simplify current/voltage control and/or reduce current and torque ripples.

As will be understood the present invention greatly improves proximity of semiconductor switch devices on massive busbar-heat-sinks thereby readily providing mechanical symmetry with exceptional component heat dissipation.

Figure 4A:
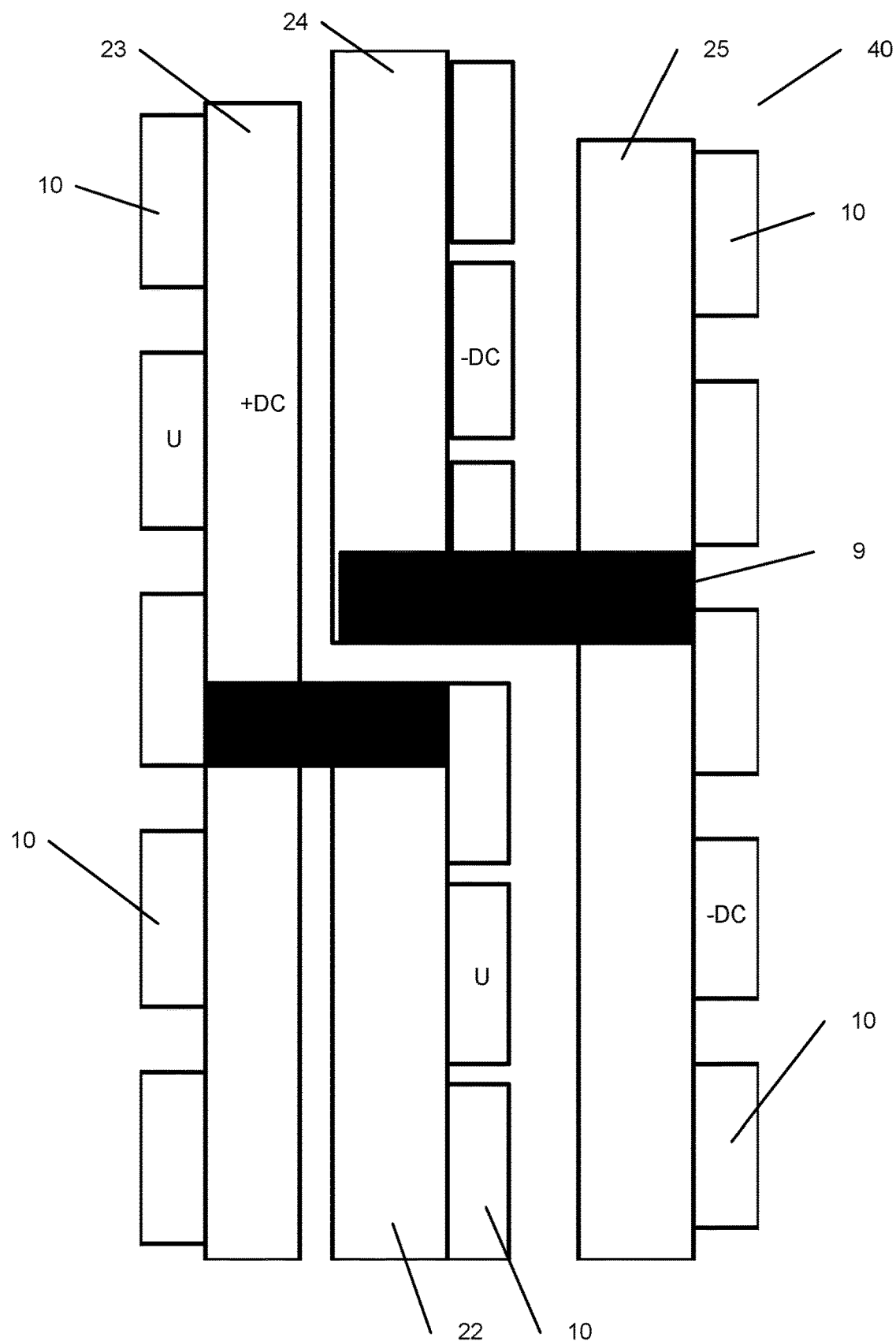
FIGS. 4*a, b, c* show heatsink-busbar arrangements showing busbar function circuit.

In FIGS. 4a,b,c power semiconductor switches 10 of an inverter sub-assembly 40 are solder bonded to heatsink-busbars 22, 23, 24, 25 and are grouped to permit a simple change during production to provide a 2 level inverter (FIG. 4a) or a 3 level T-type inverter (FIG. 4b) topology.

Figure 4B:
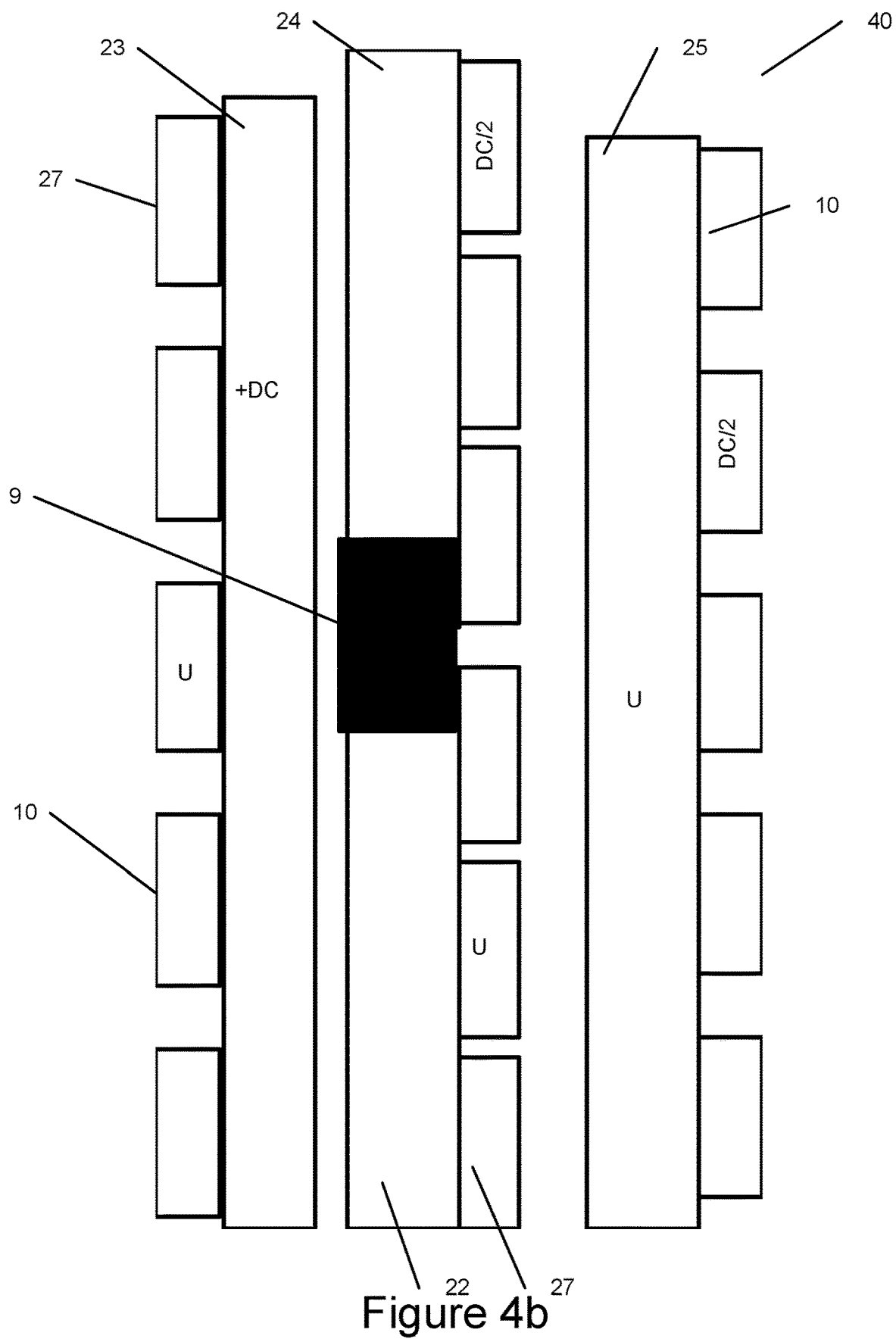
Figure 4C:
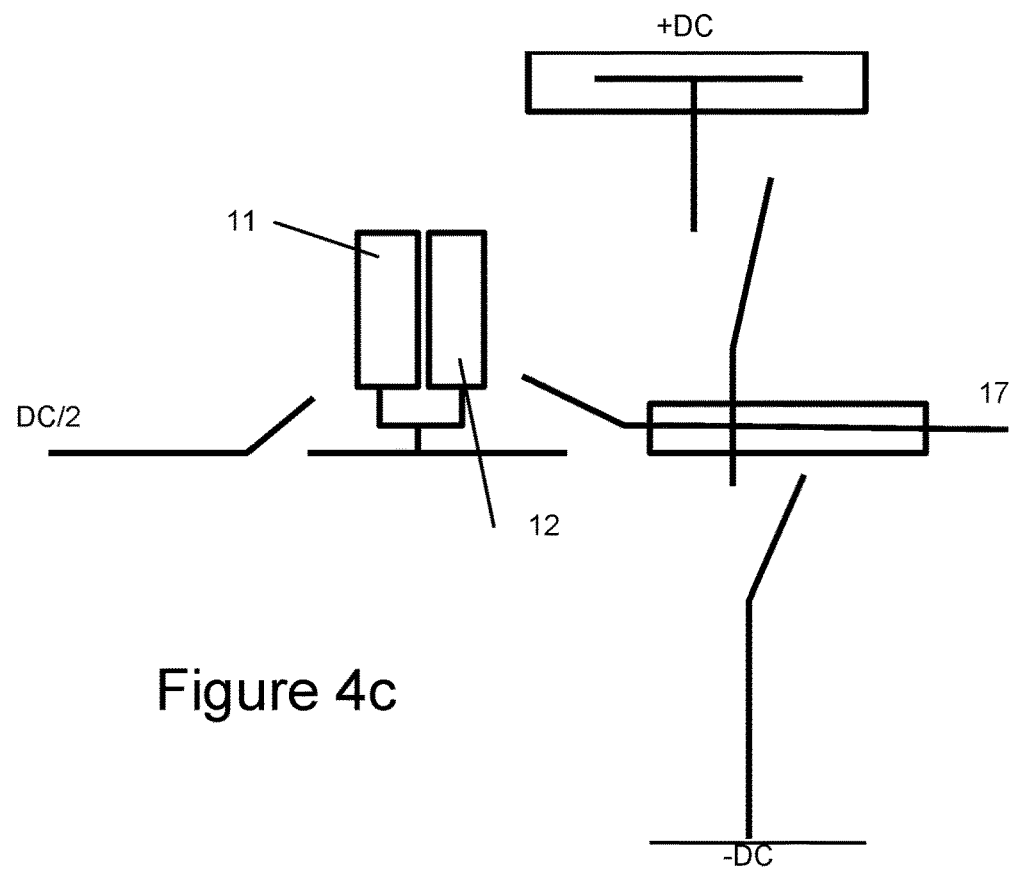

FIG. 4c shows a schematic of voltage division across the semiconductor device switches 10 for a three level T-type inverter by tying the mid-switch voltage collectors to the DC/2 midpoint of capacitors 11,12. Output 17 from such a module sub-assembly for a 3 level T-type inverter is one of U, V or W phase.

In case of three voltage level T-type inverter FIG. 4b, mid supply voltage collectors are common and connected by being solder bonded together onto heatsinks 22, 24. Other suitable means of bonding include mechanical attachment, silver or aluminium brazing gold silicon eutectic bonding, room temperature liquid metal connection and in all instances bonding should achieve sufficient mechanical and excellent thermal and electrical connection. The result is four heatsink-busbars per output phase the potentials of which are:

+DC bus 23
mid switch collectors 24 at potential of capacitor 11
mid switch collectors 22 at potential of capacitor 12
output phase 27

For a three voltage level T-type inverter mid switch collectors 22 and 24 are electrically connected by a suitably sized electrical bridge 9.

Those skilled in the art will see that mid switch collectors (heatsink-busbars) 22 and mid switch collectors (heatsink-busbars) 24 can be a single heatsink-busbar if the ability to change to a two voltage level inverter is not required. This would result in three heatsink-busbars per output phase.

Those skilled in the art will also see that the +DC bus heatsink-busbar can be shared by all three phases.

Figure 5A:
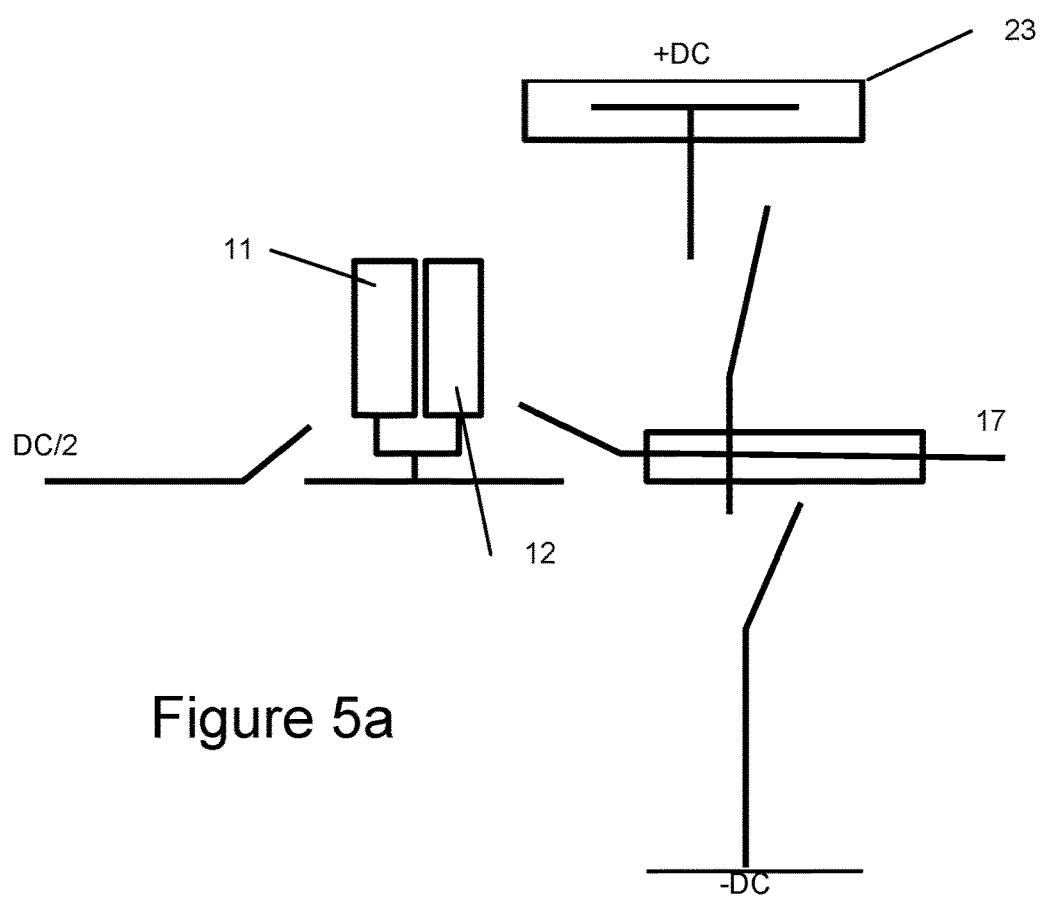
FIGS. 5*a,b* show heatsink-busbar arrangements to provide a 3 level T-type topology.
Figure 5B:
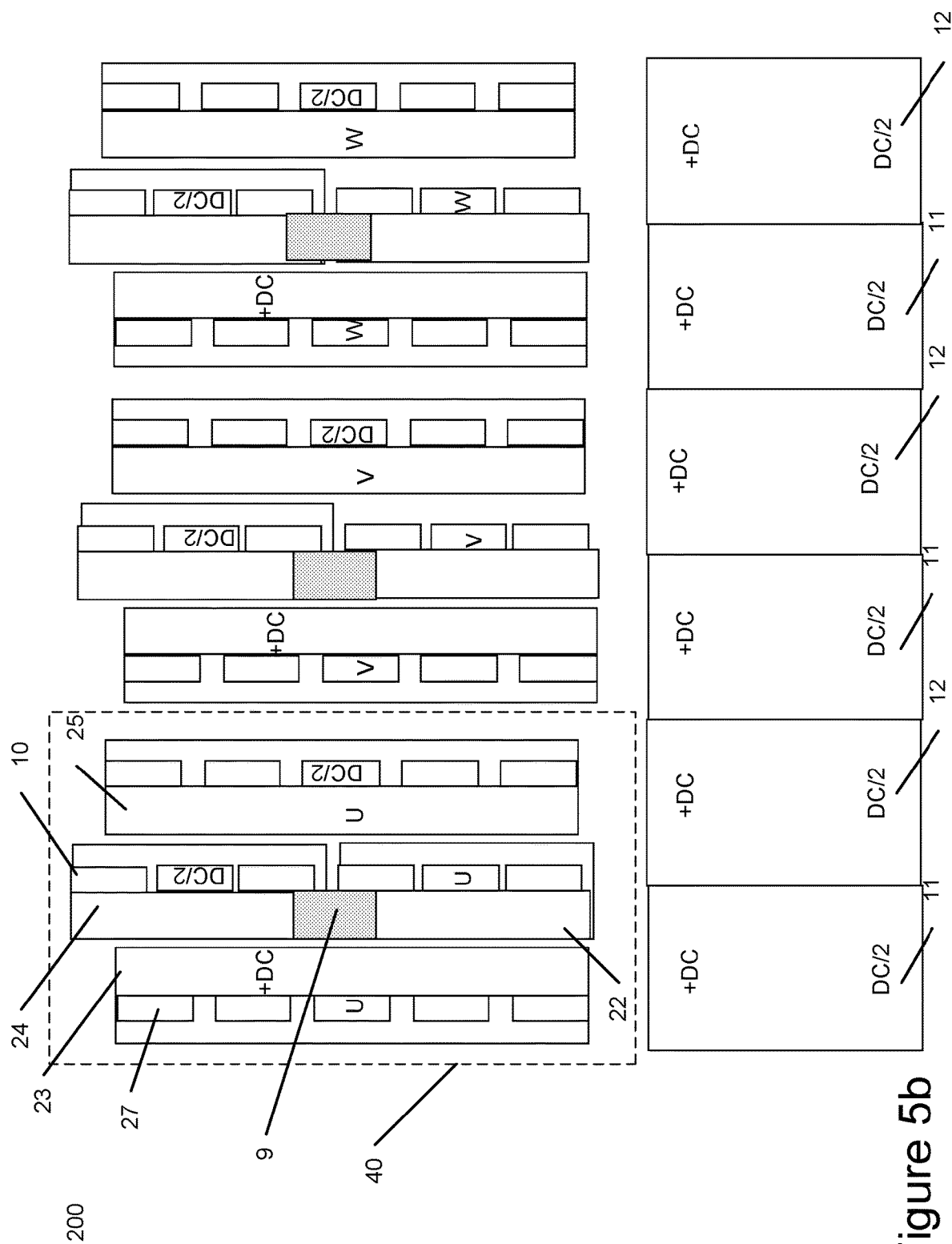

With reference to FIG. 5b there is shown an arrangement of phase sub-modules 40 in which semiconductor switches (IGBTs, for example) 10 are interconnected by way of heatsink-busbars 22, 23, 24, 25 with bridge 9 between heatsink-busbars 22 and 24, one such sub-module 40 being outlined by a dashed box, said module 40 having reference numerals with their previously used meanings. Additionally there is shown associated capacitors 11, 12 which together form a DC to 3-phase AC inverter 200 of three level T-type topology.

FIG. 5a is a schematic representation of an inverter submodule 40 of FIG. 5b showing functional circuitry and relationship to capacitors 11, 12.

Figure 6A:
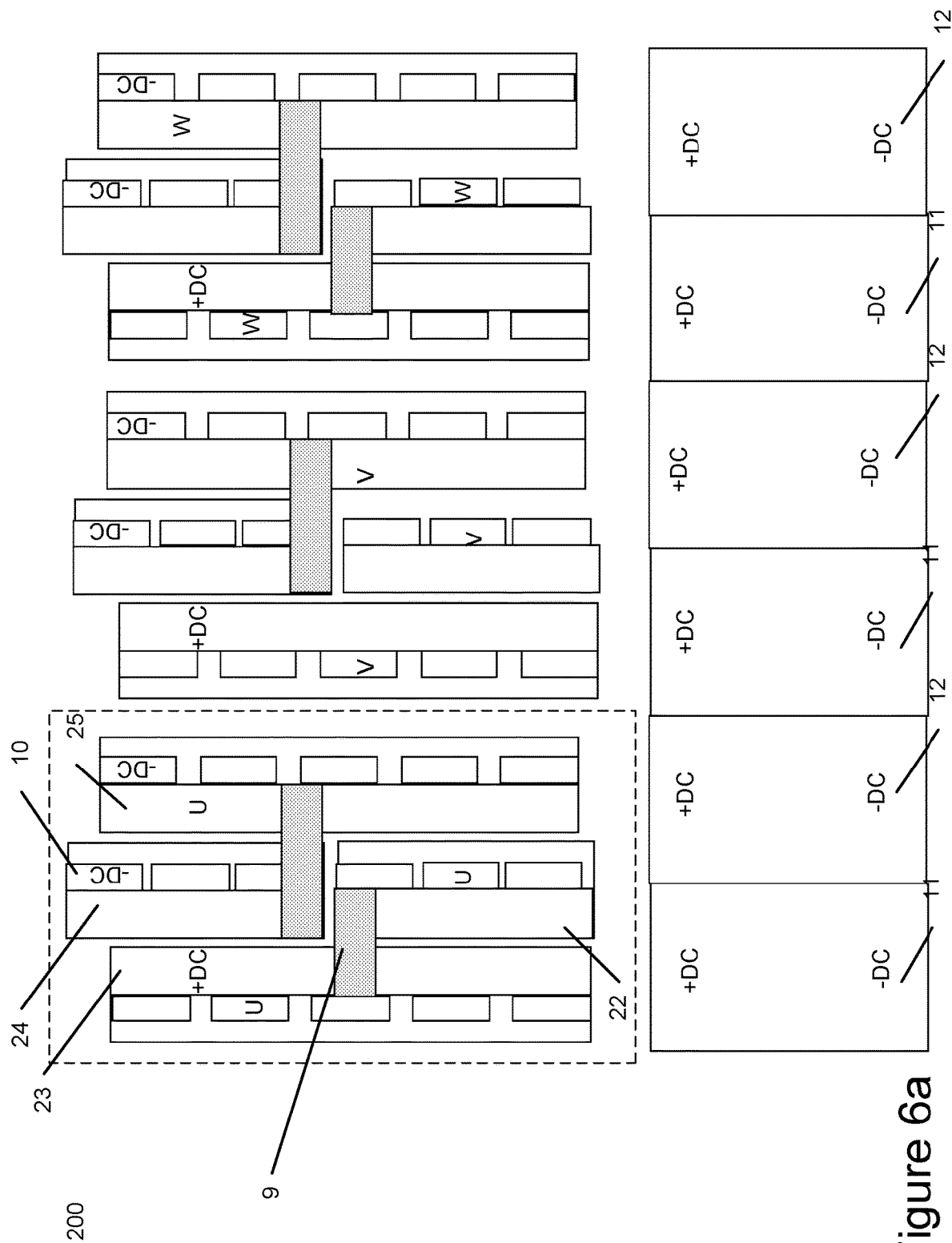
FIGS. 6*a,b* show heatsink-busbar arrangements to provide a 2 level topology.
Figure 6B:
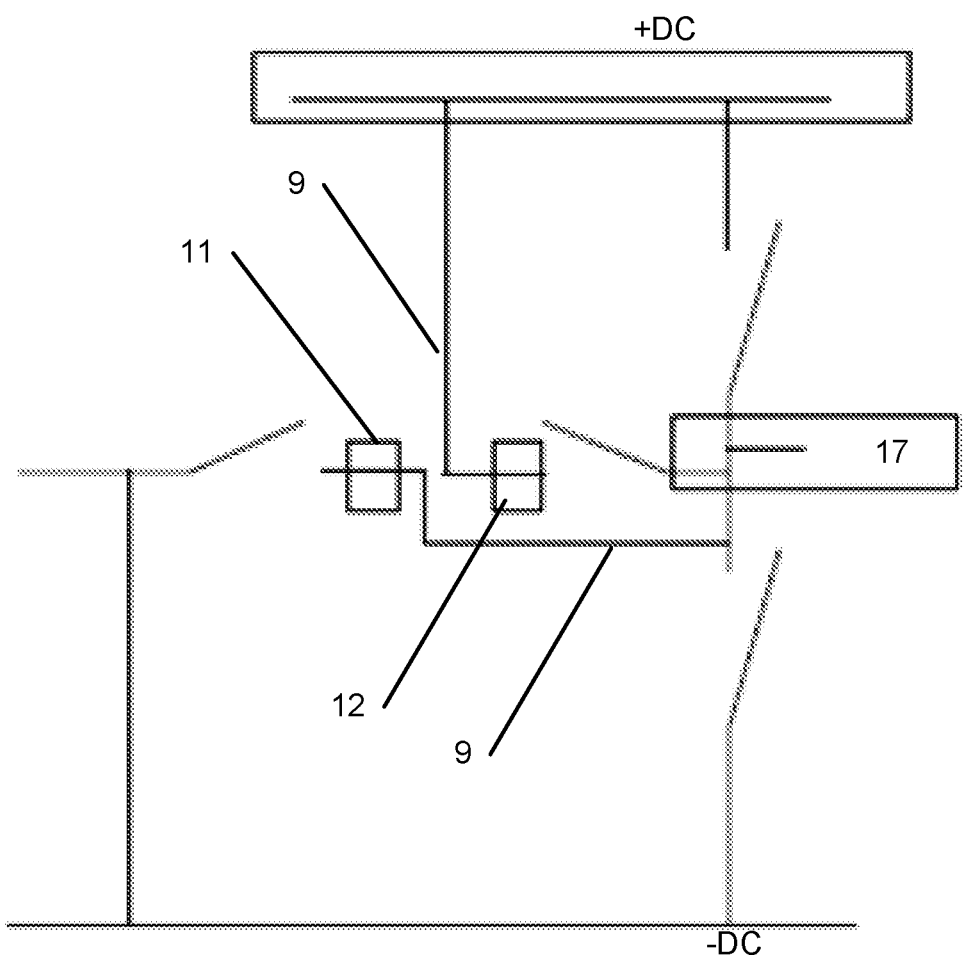

A two level topology inverter FIGS. 6a,b has a different arrangement of bridge links 9 between heatsink busbars.

In case of a two voltage level inverter with reference to FIG. 4a and FIGS. 6a,b, mid switch collectors heatsink-busbar 24 is electrically connected to the output phase heatsink-busbar 25 and the mid switch collectors heatsink-busbar 22 is electrically connected to the heatsink-busbar 23 which is held at the DC +ve potential.

Those skilled in the art will see that mid switch collectors 24 and output phase heatsink-busbars 25 could be a single heatsink-busbar and that the mid switch collectors 22 and +DC bus heatsink-busbars 23 could be a single heatsink-busbar if the ability to change to a three voltage level inverter was not required. This would result in two heatsink-busbars per output phase.

It will be appreciated arrangement of semiconductor switch devices e.g. IGBTs on heatsink-busbars in two level inverters or in 3 level T-type inverters either in fixed or adaptable formats still enables close proximity of switch devices and precision in symmetry of component placement and connection.

In embodiments heatsinks are used both for thermal management and as busbars to conduct current between connected devices. Heatsinks thereby become active parts of inverter circuitry leading to matched and reduced inductive impedance by virtue of short, massive conduction paths. Use of direct solder bonding of semiconductor device switches provides a common low electrical resistance electrical interface and a low thermal resistance thermal interface, the latter aspect allowing devices to carry more power before they are thermally limited.

Ease of providing electrical symmetry under alternating current flow and removing heat by virtue of heat-sink busbars is further enhanced by submerging electrical and electronic components of inverters of the present invention in a dielectric cooling medium which is preferably pumped along a predetermined cooling path within a liquid tight casing containing said inverter components.

Figure 7:
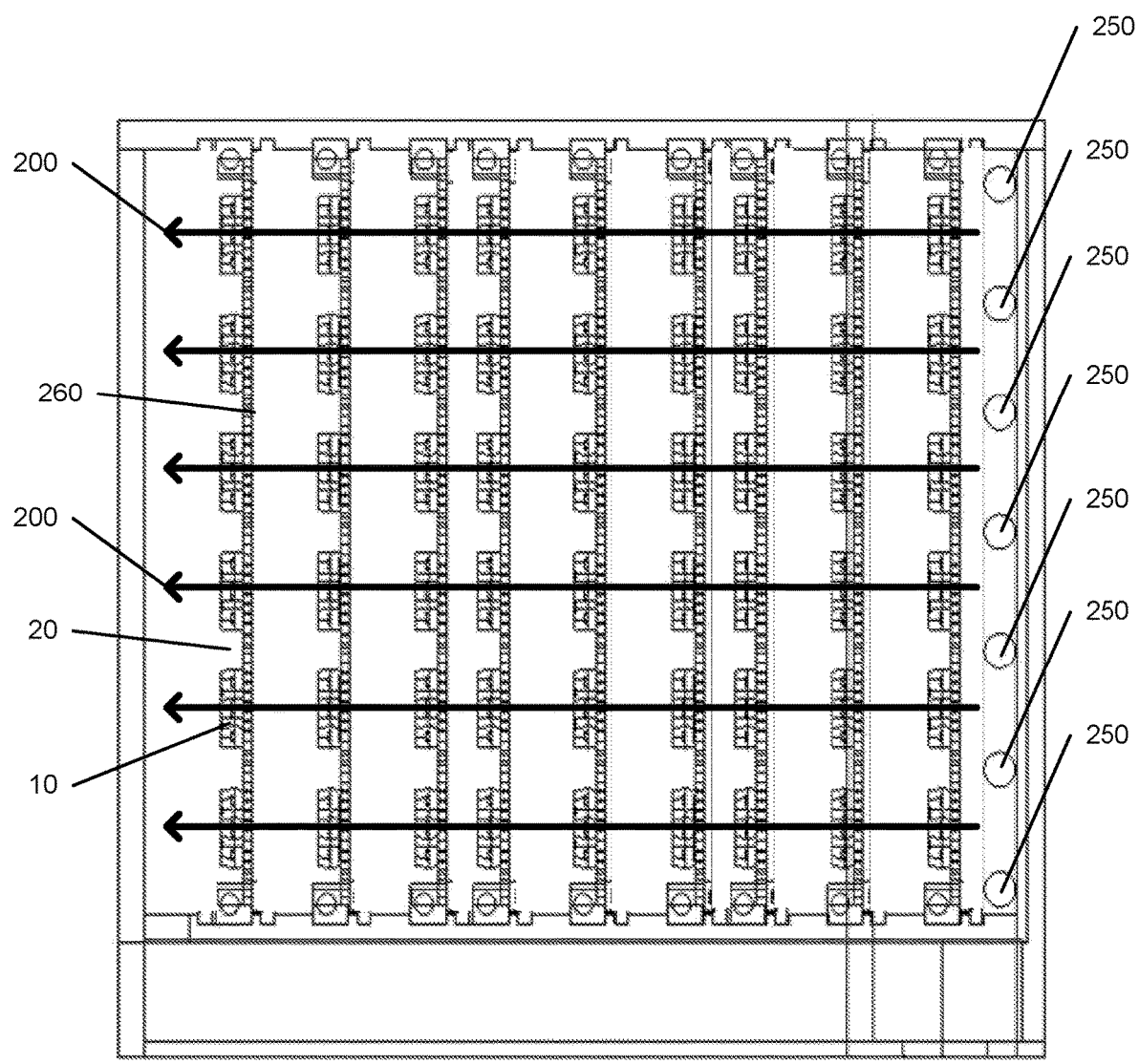
FIG. 7 shows an inverter module with symmetric arrangement and fluid flow paths.

FIG. 7 shows a symmetric arrangement of semiconductor devices bonded so as to be electrically, thermally and mechanically attached to heatsink-busbars 20, which allows for well-defined fluid pathways with well-defined narrow channels 200. Said semiconductor devices being further electrically connected by way of a printed circuit board (not shown) on to which printed circuit board additional electrical and electronic components to enable proper functioning of the inverter may also be mounted.

In FIG. 7 there is seen an arrangement of semiconducting switch devices 10 (IGBTs for example) bonded to holed heatsink-busbars 20, also printed circuit board(s) and additional componentry (not shown) said whole arrangement; heatsink-busbars, semiconductor device switches (IGBTs), printed circuit boards, additional electrical and electronic componentry, being immersed in a coolant medium wherein said cooling medium entering from the right hand side 250, which is caused to flow through holes 260 in the heatsink-busbars 20 thereby removing heat from the semiconducting switch devices 10. Coolant medium being impelled to flow by reason of being pumped, for example.

Figure 8:
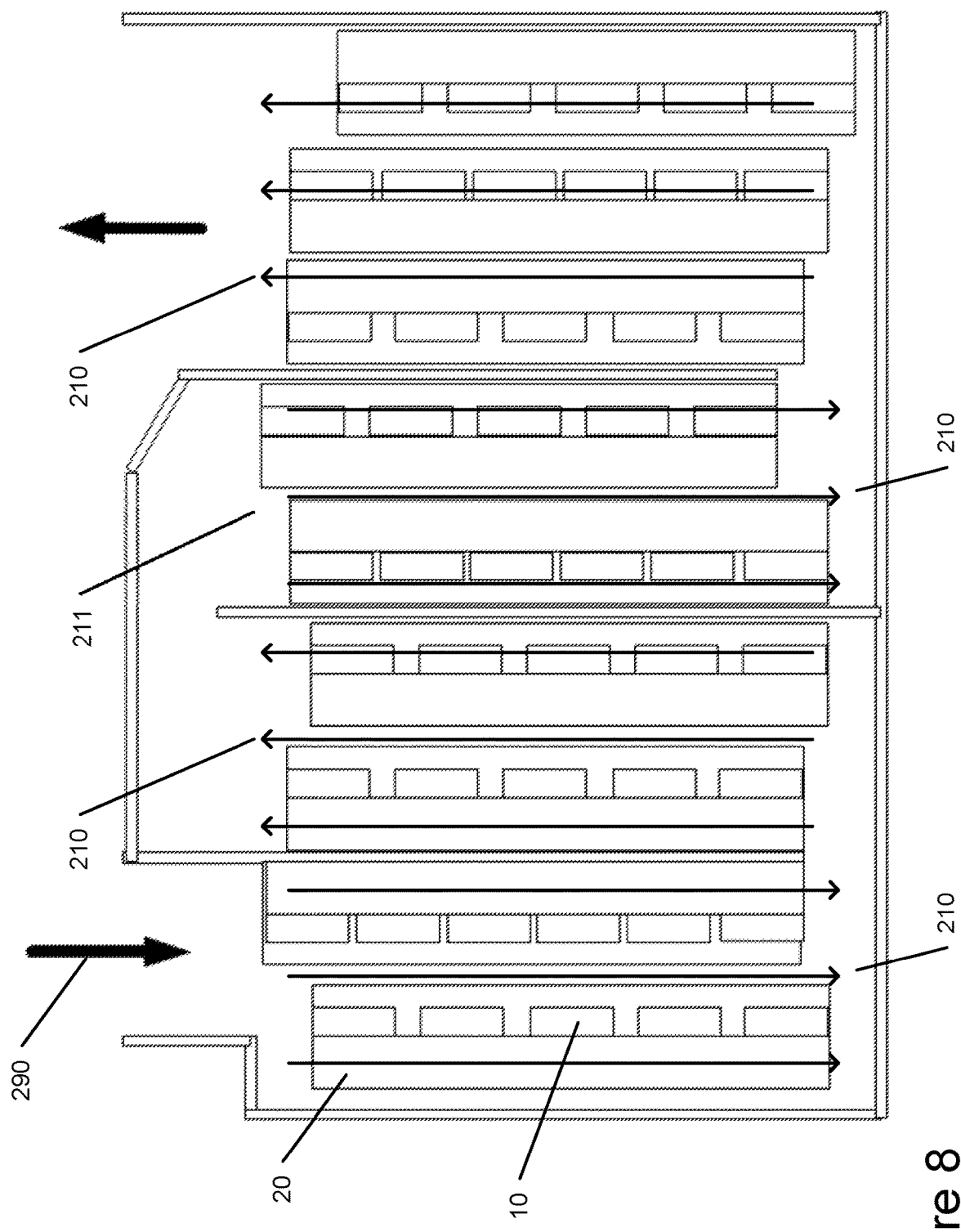
FIG. 8 shows various arrangements of coolant circuits.

In a similarly symmetric arrangement shown in FIG. 8, groups of semiconductor devices attached so as to be electrically, thermally and mechanically bonded to heatsink-busbars 20 allows for well-defined fluid pathways with well-defined narrow channels 210. In FIG. 8 there is seen an arrangement of semiconducting switch devices 10 (IGBTs) bonded to extruded finned heatsink-busbars 20, said arrangement being immersed in a coolant medium 211 wherein said cooling medium 211 entering from the top left hand side of the array 290, which is caused to flow back and forth at least along heatsink fin channels 210 part of the heatsink-busbars 20 thereby removing heat from the semiconducting switch devices 10. Coolant medium 211 being impelled to flow by reason of being pumped.

Inverter systems of the present invention comprising heatsink busbars on which are attached semiconducting device switches so as to be electrically, thermally and mechanically bonded, said semiconducting devices also being interconnected by way of printed circuit board(s) and further electrically connected with electrical and electronic components to form inverter and possibly controller circuitry are housed in a liquid tight housing (not shown) having ports for coolant medium entry and exit (not shown) and ports for electrical interfaces (not shown). Coolant medium is pumped to enable flow and hence removal of heat from said inverter systems and said coolant medium is moved typically to an external heat exchanger. For some applications it may be possible for sufficient heat to be dissipated by heat dissipating fins mounted or formed in said housing surfaces. In some embodiments it may be possible for a pump within said housing to move coolant medium in a closed circuit using only housing fins to remove heat from an inverter system.

Coolant medium used in the present invention is a dielectric fluid for example, a poly alpha olefin (PAO), fluorocarbon fluid such as Fluroinert™, coolant fluids may be single or dual phase and cooling may be derived from liquid heat capacity or heat of vaporisation, such coolant media are well known and are useful for cooling electronic components, and systems e.g. semiconductor devices, capacitors and resistors and sub-assemblies assembled to form inverters and controllers. Said coolant may also be used to cool electric machines e.g. motors/generators that may be powered/controlled by said electronic systems.

Figure 9A:
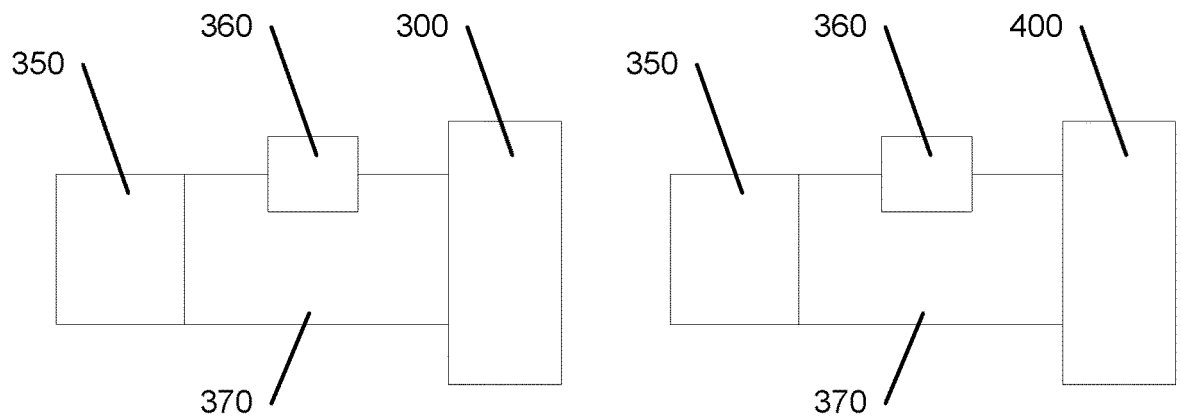
FIGS. 9*a, b, c* show coolant circuits.

With reference to FIGS. 9a, b, c: FIG. 9a shows two separate coolant circuits one for a control/power-supply system e.g. inverter/controller 300 and another for an electric machine e.g. motor/generator 400. Each coolant circuit may comprise a heat-exchanger 350 a pump 360 and fluid supply/return lines 370.

Figure 9B:
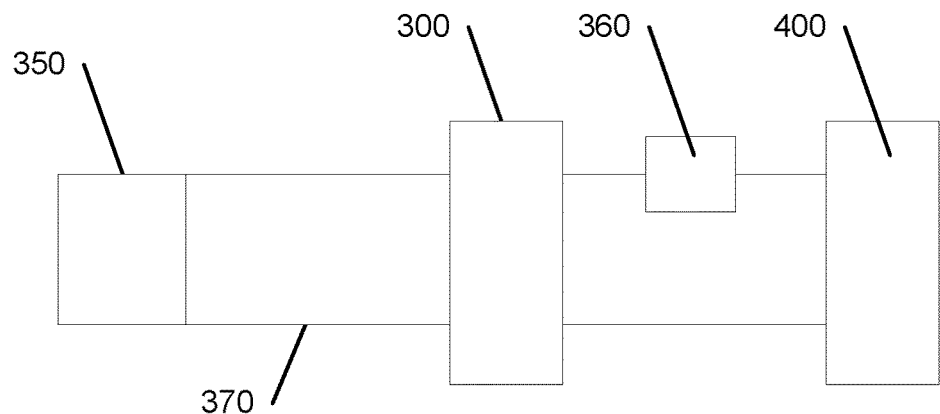
Figure 9C:
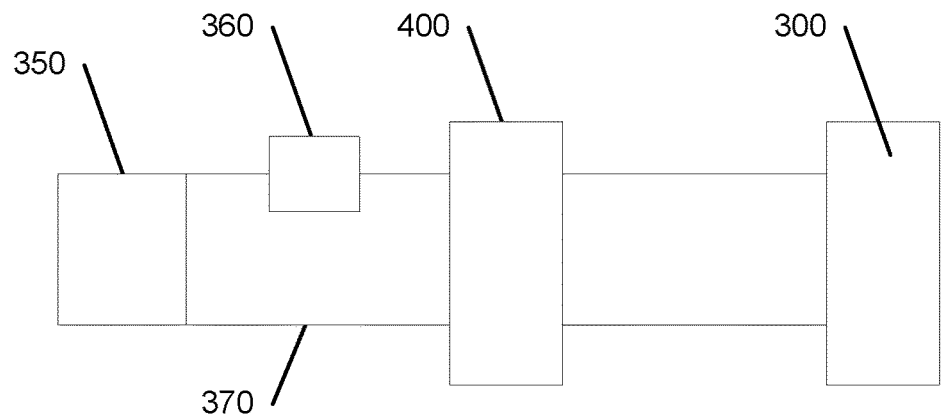

FIGS. 9b and 9c show a cooling configuration where a single heat-exchanger 350 and single pump 360 are used to cool an inverter/controller 300 and subsequently an electric machine 400.

In FIG. 9b pump 360 for impelling coolant medium around coolant circuit along fluid lines 370 is placed between inverter/controller 300 and electric machine 400.

Placement of pump is a function of space, ease of access and removal of air pockets among several other factors and may as easily be placed between heat-exchanger 350 and electric machine 400 FIG. 9c.

Decision on which is cooled first, electric machine or controller/power-supply is usually based on which dissipates the most heat when in use.

No doubt many other effective alternatives will occur to the skilled person. It will be understood that the invention is not limited to the described embodiments and encompasses modifications apparent to those skilled in the art lying within the scope of the claims appended hereto.

The invention claimed is:

1. An inverter for converting DC to AC, comprising:
   one or more inputs for receiving one or more DC voltages;
   one or more outputs for outputting one or more AC voltages;
   a plurality of semiconductor arrangement modules, each module having one or more semiconductor devices thermally and electrically coupled to a heatsink, the heatsink being configured as a bus bar to electrically connect the one or more semiconductor devices together to transmit power between the one or more semiconductor devices and the heatsink comprising one or more heat exchanging elements to transfer the heat from the heatsink into the surrounding environment, the plurality of semiconductor arrangement modules being coupled to the one or more inputs and one or more outputs, and the semiconductor arrangement modules being mounted to a Printed Circuit Board (PCB), the PCB providing electrical connections between the semiconductor devices, the one or more inputs and the one or more outputs; and
   a housing for housing the plurality of semiconductor arrangement modules in a chamber within the housing, the housing comprising inlet and outlet ports in fluid communication with the chamber respectively for receiving and outputting a dielectric cooling medium, wherein the chamber is flooded with the cooling medium that flows through the chamber to cool the inverter,
   wherein the PCB and additional electrical and electronic components mounted on the PCB are located within the chamber and immersed in the flowing cooling medium.

2. The inverter according to claim 1, wherein the input DC voltages comprise a +DC input voltage and/or a DC input voltage, and wherein the AC output comprises an AC phase output voltage.

3. The inverter according to claim 1, wherein the each of the plurality of semiconductor arrangement modules has a longitudinal axis, and wherein each module is mounted on the PCB such that the longitudinal axes of the modules are parallel to one another.

4. The inverter according to claim 3, wherein the modules are arranged on the PCB so as to be symmetrical in at least one axis.

5. The inverter according to claim 1, wherein the modules are electrically arranged to provide a three level T-type topology or a two level topology.

6. The inverter according to claim 5, wherein when configured as a three level T-type topology, the inverter comprises a second DC output at a DC/2 voltage.

7. The inverter according to claim 5, wherein the electrical arrangement between the modules is configurable via one or more connector bars, each of the one or more connector bars connecting the heatsink bus bars of two modules together in order to provide the three level T-type topology or the two level topology.

8. The inverter according to claim 7, wherein the inverter comprises four modules arranged in a three level T-type configuration, and wherein the heatsink bus bars of two of the four modules are electrically connected together using a connector bar.

9. The inverter according to claim 8, wherein the heatsink bus bars of the second and third of the modules, located on the PCB between the first and fourth modules, are electrically connected together using the connector bar.

10. The inverter according to claim 7, wherein the inverter comprises four modules arranged in a two level T-type configuration, and wherein the heatsink bus bars of a first group of two modules are electrically connected together using a first connector bar, and wherein the heatsink bus bars of a second group of two modules are electrically connected together using a second connector bar.

11. The inverter according to claim 10, wherein second and third of the modules are located on the PCB between the first and fourth modules, and wherein the heatsink bus bars of the first and third modules are electrically connected together using the first connector bar, and wherein the heatsink bus bars of the second and fourth modules are electrically connected together using the second connector bar.

12. The inverter according to claim 5, wherein the inverter comprises three modules arranged in a three level T-type configuration, first and third of the modules being located on the PCB either side of the second module.

13. The inverter according to claim 1, comprising two or more pluralities of semiconductor arrangement modules, each of the two or more pluralities of semiconductor arrangement modules providing one phase of a multiphase output AC voltage.

14. The inverter according to claim 1, wherein the cooling medium is pumped so as to cause the medium to flow between the inlet port and the outlet port.

15. The inverter according to claim 1, wherein the inverter inlet port and outlet port are coupled to a cooling circuit comprising a heat exchanger, the heat exchanger for removing heat from the cooling medium.

16. The inverter according to claim 15, wherein the output of the inverter is configured to power an electric motor, and wherein the cooling circuit is in fluid communication with a cooling circuit of the electric motor.

17. The inverter according to claim 1, wherein the output of the inverter is configured to power an electric motor.

18. The inverter according to claim 1, wherein the one or more semiconductor devices are semiconductor power devices.

19. The inverter according to claim 1, wherein the one or more semiconductor devices comprise an IGBT, Silicon carbide (SiC) semiconducting switch devices, metal oxide semiconducting field effect transistors (MOSFETs), or power diodes.

20. The inverter according to claim 1, wherein the one or more semiconductor devices are mechanically attached or bonded to the heatsink.

21. The inverter according to claim 1, wherein the heat exchanging elements comprise: fins, pin-holes, holes or slots of regular or irregular profiles.

* * * * *